United States Patent [19]

Tsunemi et al.

[11] Patent Number: 4,943,474

[45] Date of Patent: Jul. 24, 1990

[54] UNSATURATED POLYESTER RESIN COMPOSITIONS AND ELECTRICAL LAMINATES MADE THEREFROM

[75] Inventors: Hidenari Tsunemi, Otsu; Yasuo Fushiki, Takatsuki; Asaichi Nishimura; Yousuke Kawai, both of Otsu, all of Japan

[73] Assignee: Kanegafuchi Kagaku Kogyo Kabushiki Kaisha, Osaka, Japan

[21] Appl. No.: 296,159

[22] Filed: Jan. 12, 1989

[51] Int. Cl.$^5$ ............................................. C08L 67/06
[52] U.S. Cl. ................................. 428/246; 428/287; 428/482; 525/39; 525/42; 525/44; 525/48
[58] Field of Search .................. 428/246, 287, 482; 525/39, 41, 42, 44, 48

[56] References Cited

U.S. PATENT DOCUMENTS

| | | | |
|---|---|---|---|
| 4,372,800 | 2/1983 | Oizumi | 428/246 |
| 4,483,963 | 11/1984 | Meyer | 525/44 |
| 4,710,420 | 12/1987 | Tonoki | 428/212 |

*Primary Examiner*—Patricia Short
*Attorney, Agent, or Firm*—Millen, White & Zelano

[57] ABSTRACT

An unsaturated polyester composition is provided comprising an unsaturate polyester component, a cross-linking monomer and as a modifier of the resin a polyoxyalkylene alcohol at least partially esterified with a polymerizable unsaturated carboxylic acid. The modifier is produced by esterifying the hydroxy group of a polyoxyalkylene mono- or polyalcohol at least partially with a polymerizable carboxylic acid such as maleic acid.

15 Claims, No Drawings

UNSATURATED POLYESTER RESIN COMPOSITIONS AND ELECTRICAL LAMINATES MADE THEREFROM

BACKGROUND OF THE INVENTION

This invention relates to an unsaturated polyester resin composition which is particularly useful in the manufacture of electrical laminates. The term "electrical laminates" as used herein refers to unclad insulation boards for mounting various electrical and electronic parts thereon as well as one or both sided metal clad laminates for use in the manufacture of printed circuit boards (PCBs). They are normally in the form of a flat sheet having a thickness of about 0.5–5 mm.

Electrical laminates made from unsaturated polyester resins are now commercially available and consumed in large quantities. These laminates are produced by pre-treating a cellulosic substrate with a melamine-type resin, impregnating the substrate with a liquid unsaturated polyester resin, laminating a plurality of the resin-impregnated substrates, and curing the laminate. A continuous process for the production thereof is disclosed in U.S. Pat. No. 4,372,800 assigned to the assignee of this application.

Unsaturated polyester resins in general find a variety of uses owing to their excellent mechanical properties and molding workability with various reinforcing materials. For use in the manufacture of PCBs, they must comply with high standard requirements for properties in terms of punching property, solder dip resistance, impact strength and the like. Needs exist for resins having an improved impact strength without deteriorating heat resistance in the field of large FRP products. These property requirements have become more stringent as automated processing of PCBs has become more popular and parts are packaged thereon more densely. However, these requirements are often incompatible. For example, it has been difficult to improve both the heat resistance and impact strength simultaneously or to improve all of the low temperature-punchability, solder dip resistance and impact strength while keeping a good balance among them.

Attempts have been made to improve the impact strength by modifying unsaturated polyester resins with flexible resins, plasticizers, liquid butadiene-based polymers, cross-linked diene- or acrylic-based rubbers and the like. However, the incorporation of these modifiers is not satisfactory in that they tend to deteriorate heat resistance, chemical resistance, stability against phase separation, substrate-impregnating properties and other properties.

It is, therefore, a major object of the present invention to overcome the above-discussed problems. Other objects and advantages thereof will become apparent as the description proceeds.

SUMMARY OF THE INVENTION

These and other objects and advantages are achieved, in accordance with the present invention, by providing an unsaturated polyester resin composition comprising an unsaturated polyester component, a cross-linking monomer and a polyoxyalkylene alcohol at least partially esterified with a polymerizable unsaturated carboxylic acid.

In a preferred embodiment of the present invention, said unsaturated polyester component is a mixture of a hard unsaturated polyester and a soft unsaturated polyester, said soft polyester containing a polyoxyalkylene segment having a molecular weight from 600 to 6000 in the backbone thereof, said hard polyester being free from said polyoxyalkylene segment.

The present invention also provides an electrical laminate comprising a plurality of layers of a fibrous substrate impregnated with the unsaturated polyester resin composition of the present invention.

Electrical laminates produced from the resin composition of the present invention exhibit improved impact strength and low-temperature punchability without deteriorating heat resistance and other properties.

DETAILED DISCUSSION

As is well-known, unsaturated polyesters are polycondensates of an $\alpha, \beta$-ethylenically unsaturated polycarboxylic acid optionally containing an unsaturated monocarboxylic acid and/or a polycarboxylic acid free from ethylenic unsaturation with a polyhydric alcohol optionally containing a monoalcohol. Unsaturated polyester resins are mixtures of the unsaturated polyester and a cross-linking monomer, typically styrene.

The unsaturated polyester composition of the present invention additionally contains, as a modifier of the unsaturated polyester resin, a partially esterified product of a hydroxy-terminated polyoxyalkylene compound.

Although any conventional unsaturated polyester resin may be modified by the present invention, an unsaturated polyester resin formulation containing a hard unsaturated polyester and a soft unsaturated polyester as disclosed in U.S. Pat. No. 4,710,420 assigned to the assignee of this application is preferable. The entire disclosure of said patent is incorporated herein by reference. The soft polyester component contains a polyoxyalkylene segment having a molecular weight from 600 to 6000 in the backbone thereof, while the hard polyester component is free from said polyoxyalkylene segment.

The hard polyester component may be prepared by reacting an unsaturated polycarboxylic acid, acid anhydride or mixtures thereof optionally containing an unsaturated monocarboxylic acid and/or a saturated polycarboxylic acid with a polyhydric alcohol optionally containing a mono alcohol.

Examples of unsaturated polycarboxylic acids and acid anhydrides include maleic anhydride and fumaric acid. The term "unsaturated" as used herein means an ethylenic unsaturation present between alpha and beta positions relative to the carboxyl group. Maleic acid dicyclopentadiene monoester (DCPD monomaleate) is an example of unsaturated monocarbocylic acid. Examples of saturated polycarboxylic acid include phthalic acid, isophthalic acid, terephthalic acid, tetrahydrophthalic acid, endic acid, trimellitic acid, pyromellitic acid, tetrabromophthalic acid, dibromoterephthalic acid, chlorendic acid, adipic acid, succinic acid, azelaic acid, sebacic acid and acid anhydrides of these acids. The term "saturated" as used herein means the absence of an ethylenic unsaturation between alpha and beta positions relative to the carboxyl group. It is desirable that the sum of unsaturated polycarboxylic acid and unsaturated monocarboxylic acid occupy from 40 to 100 mole % of the total acid reactants.

Examples of polyhydric alcohols includes ethylene glycol, propylene glycol, butanediol, neopentyl glycol, diethylene glycol, dipropylene glycol, hexanediol, hydrogenated bisphenol A, glycerine, trimethylolpropane, pentaerythritol, dibromoneopentyl glycol, adducts of ethylene oxide or propylene oxide with bisphenol A, adducts of ethylene oxide or propylene oxide with tetrabromobisphenol A and bisphenol A epoxide. Examples of monoalcohols include hydroxylated dicyclopentadiene, ethylene glycol monomethyl ether, cinnamyl alcohol and stearyl alcohol.

For use in the manufacture of electrical laminates, the hard polyester component may preferably be flame retarded. This may be effected by synthesizing the polyester using halogen-containing acid or alcohol components such as dibromophthalic acid, chlorendic acid, dibromoneopentyl glycol or adducts of ethylene oxide or propylene oxide with tetrabromobisphenol A. Alternatively an unsaturated polyester may be synthesized using as a part of acid and/or alcohol reactants a compound having a double bond to which a halogen molecule may preferentially be added. Thereafter the resulting polyester may be post-halogenated without halogenating ethylenic alpha, beta unsaturation. Examples of such acid and alcohol reactants include DCPD monomaleate, tetrahydrophthalic acid, hydroxylated DCPD and cinnamyl alcohol. In a preferred embodiment, the hard polyester component is prepared by post-brominating an unsaturated polyester including a tetrahydrophthalic acid moiety in the middle of the polymer chain and a DCPD monomaleate moiety at each terminal of the polymer chain.

The soft polyester component used in the present invention may be prepared in the same way as the hard polyester component as discussed above except that the soft polyester component additionally contains an polyoxyalkylene segment having a molecular weight from 600 to 6000 in the backbone thereof. The incorporation of polyoxyalkylene segment may be effected by using as a part of alcohol reactants a polyoxyalkylene monoalcohol and/or a polyoxyalkylene polyol having a molecular weight of 600 to 6000, or by copolymerizing said polyoxyalkylene mono- and/or polyalcohol with an oligomer of unsaturated polyester free from the polyoxyalkylene segment. The polyoxyalkylene chain content of the soft polyester may range from 25 to 75%, preferably from 25 to 50%, more preferably from 25 to 40% by weight. Examples of polyoxyalkylene chains include homopolymers of propylene oxide, copolymers of propylene oxide and ethylene oxide, copolymers of propylene oxide and tetramethylene oxide and copolymers of ethylene oxide and tetramethylene oxide. Polyoxypropylene mono- or polyalcohols are preferable. Preferably the soft polyester component also has a DCPD monomaleate moiety at each terminal. This increases its compatibility with the hard unsaturated polyester component and decreases the moisture absorption of the entire composition. The soft polyester component may or may not be post-halogenated for rendering flame retardant.

The modifier ester may be synthesized by esterifying polyoxyalkylene mono- or polyalcohols with a polymerizable unsaturated carboxylic acid by the conventional method. The term "at least partially esterified" refers to about 20 to 80 mole %, preferably about 40 to 70 mole % of the hydroxy group possessed by the polyoxyalkylene polyols, and about 40 to 100 mole %, preferably about 80 to 100 mole % of the hydroxy group possessed by the polyoxyalkylene monoalcohols are esterified with the polymerizable unsaturated carboxylic acid. Within these ranges of degree of esterification, the polyoxyalkylene ester exhibits a good compatibility with other components and the entire composition exhibits a reduced moisture absorption.

Examples of polyoxyalkylene alcohols include diols such as polyethylene glycols, polypropylene glycols, ethylene oxide-propylene oxide block or random copolymers; polyols having corresponding polyoxyalkylene chains derived from polyols such as glycerine, trimethylolpropane, pentaerythritol and the like, and monoethers and monoesters of the above polyoxyalkylene diols. The polyoxyalkylene alcohols preferably have an average molecular weight from 2000 to 8000. Examples of polymerizable unsaturated carboxylic acids includes acrylic acid, methacrylic acid, crotonic acid, fumaric acid, maleic acid and maleic anhydride. Maleic anhydride is preferable. The reaction of maleic anhydride with the polyoxyalkylene alcohol may be carried out at a temperature from 60° C. to 170° C., preferably from 100° C. to 150° C. under normal or elevated pressures. The completion of the esterification reaction may be determined by the acid number or viscosity of the reaction mixture. The reaction is preferably carried out under pressure for promoting the reaction and also for preventing sublimination of maleic anhydride. Care should be taken, however, that the reaction temperature does not exceed 170° C. at which a polycondensation reaction begins to take place. The modifier ester is added in an amount of 2 to 10 % by weight of the composition.

Examples of cross-linking monomers include styrene, α-methylstyrene, vinyltoluene, p-methylstyrene, chlorostyrene, divinylbenzene, $C_{1-10}$ alkyl acrylates, $C_{1-10}$ alkyl methacrylate, hydroxyalkyl acrylates, hydroxyalkyl methacrylates, diallyl phthalate, triallyl cyanurate and mixtures of these monomers. Styrene is most preferable. The proportion of cross-linking monomer ranges between 10 and 70%, preferably 20 and 50% based on the combined weight of the hard polyester, the soft polyester, the modifier ester and the cross-linking monomer.

The proportions of the soft polyester component and the modifier ester in the entire resin composition are such that the total polyoxyalkylene chain content ranges from 5 to 30%, preferably from 6 to 25%, more preferably from 8 to 20% based on the combined weight of the hard polyester, the soft polyester, the modifier and the cross-linking monomer.

The unsaturated resin composition of the present invention may contain conventional additives such as additive type flame retardants, fillers, antioxidants, stabilizers, other polymers, colorants and the like as desired. Examples of additive type flame retardants include phosphorus based flame retardants such as trioctyl phosphate, triphenyl phosphate, tricresyl phosphate, triethyl phosphite, triphenyl phosphite, tris-(chloroethyl)phosphate and red phosphorus; halogenated flame retardants such as chlorinated paraffin, tetrabromobisphenol A and its derivatives, and tribormophenyl monoglycidyl ether; antimony compounds such as antimony tri-or pentoxide and sodium antimonate; and other flame retardants such as zinc borate and aluminum hydroxide.

In order to promote the compatibility of the modifier component with other components, a small amount of substances such as polycaprolactone, saturated polyesters, vegetable oil derivatives, dimer acid derivatives, xylene resins and mixtures of these substances may be added.

The resin composition of the present invention may be cured using any conventional peroxide catalyst. Examples of preferred peroxide catalysts include peroxy ketals such as 1,1-bis-(t-butylperoxY)-3,3,5-trimethylcyclohexane and 1,1-bis-(t-butylperoxy)cyclohexane; and dialkyl peroxides such as di-t-butylperoxide; and peroxyesters such as t-butylperoxy benzoate. These catalysts may be incorporated in amounts from 0.5 to 2.0 parts per 100 parts by weight of the resin composition. The resin composition may also be cured by irradiating with actinic radiation such as UV radiation, electron beam radiation and other radiation as desired by incorporating an appropriate curing catalyst.

The unsaturated resin composition of the present invention is highly suited for, but not limited to, the production of electrical laminates. In such use, a fibrous substrate or reinforcement is impregnated with the resin composition of the present invention. A plurality of resin-impregnated substrates are combined together optionally with a cladding metal foil being placed on one or both sides and the resulting laminate is cured. The entire operation may preferably be carried out in a continuous mode as described in the hereinbefore cited U.S. Pat. No. 4,372,800. Examples of substrates include glass substrates in the form of cloth, mat or paper; and cellulosic substrates such as kraft paper, or cotton linter paper. Cellulosic substrates pretreated with aminoplast resin are preferable.

The following examples will illustrate the present invention. All parts and percents therein are by weight unless otherwise indicated.

EXAMPLE

Soft unsaturated polyester resin (A)

A one liter flask equipped with stirrer, thermometer, nitrogen gas-introducing tube, and distillation column was charged with 69.5 g of DCPD monomaleate, 165.8 g of bis(propyleneglycol)isophthalate, 136.4 g of bis(-propyleneglycol)fumarate, 168 g of polypropylene glycol(average M.W.=1200) and 82.4 g of maleic anhydride. The reaction was continued under nitrogen gas stream at an inner temperature of 150°-200° C. until an acid number of 20 was reached. The reaction product was allowed to cool. When the temperature was dropped to 160° C., 90 mg of hydroquinone was added. When the temperature was dropped to 100° C., an amount of styrene was added to a styrene content of 35 %.

Hard unsaturated polyester resin (B)

A similar one liter flask was charged with 198.6 g of DCPD monomaleate, 236 g of bis(propyleneglycol)-fumarate, and 39.2 g of maleic anhydride. The reaction was continued at an inner temperature of 150°-200° C., until an acid number of 20 was reached. The reaction product was allowed cool. When the temperature was dropped to 160° C., 90 mg of hydroquinone was added. When the temperature was dropped to 100° C., an amount of styrene wad added to a styrene content of 35 %.

Modifier ester (C)

A one liter flask equipped with stirrer, thermometer and nitrogen gas-introducing tube was charged with 700 g of a tri-functional polyoxyalkylene polyol having an average M.W. of 3500 (EP530, MITSUI NISSO POLYURETHANE CO., LTD.) and 29.4 g of maleic anhydride. The reaction was continued at an inner temperature of 100°-150° C., for 6 hours until an acid number of 24.3 was reached.

Production of copper clad laminate 50 parts of soft polyester resin (A), 50 parts of hard polyester (B), 5 parts of modifier (C) and 1 part of BPO (benzoyl peroxide) were thoroughly mixed to prepare an impregnating liquid resin.

A kraft paper having a thickness of 285 microns was pretreated with a methanolic solution of methylolmelamine and then dried. This paper substrate was impregnated with the above liquid resin. Five plies of the resin impregnated substrates and a 35 micron thickness copper foil having a coating of epoxy adhesive were laminated. The laminate was cured at 100° C. for 30 minutes to give a one sided copper clad laminate having a thickness of 1.6 mm. Properties of the laminate are shown in Table 1.

COMPARATIVE EXAMPLE 1

A one sided copper clad laminate having a thickness of 1.6 mm was produced as the laminate of Example using a resin composition consisting of 50 parts of soft polyester resin (A), 50 parts of hard polyester resin (B) and 1 part of BPO. Properties of the laminate are shown in Table 1.

COMPARATIVE EXAMPLE 2

A one sided copper clad laminate having a thickness of 1.6 mm was produced as the laminate of Example using a resin composition consisting of 50 parts of soft polyester resin (A), 50 parts of hard polyester resin (B), 5 parts of unesterified polyoxyalkylene polyol EP530 and 1 part of BPO. Properties of the laminate are shown in Table 1.

TABLE 1

| Test item | Unit | Example | Comparative Ex. 1 | Comparative Ex. 2 |
| --- | --- | --- | --- | --- |
| Flexural modulus at 100° C. (a) | kg/mm$^2$ | 300 | 300 | 290 |
| Drop ball impact strength (b) | cm | 30 | 22 | 30 |
| Low temperature punchability (c) | | Good | Not good | Good |
| Solvent resistance (d) | | Good | Good | Not good |

(a) JIS C-6481
(b) A dropping height of a steel ball weighing 55 g to cause 50% fracture of the laminate.
(c) A punching die having a series of ten pins having a diameter of 0.8 mm arranged at an interval of 1.78 mm was used at 25° C. Evaluation was made based on the degree of delamination.
(d) Boiling in trichloroethylene for 10 minutes. Evaluation was made based on the change in appearance.

As can been seen from Table 1, the laminate of Example exhibited excellent impact strength and low temperature-punchability when comparing with the laminate of Comparative Example 1 which is free from the modifier (C). It also exhibited excellent solvent resistance when comparing with the laminate of Comparative Example 2 which contains a free polyoxyalkylene polyol corresponding to the modifier (C).

We claim:
1. An unsaturated polyester resin composition comprising (a) an unsaturated polyester component which is a mixture of (i) a hard unsaturated polyester and (ii) a soft unsaturated polyester, said soft polyester containing a polyoxyalkylene segment having a molecular height from 600 to 6,000 in the backbone thereof, and said hard polyester being free from said polyoxyalkylene segment, (b) a cross-linking monomer and (c) a polyoxyalkylene alcohol which is a monoalcohol having an average molecular weight from 2,000 to 8,000 and about 40 to 100 mole % of the hydroxy group of which is esterified with a polymerizable unsaturated carboxylic acid.

2. The composition according to claim 1 wherein said polymerizable unsaturated carboxylic acid is maleic acid.

3. The composition according to claim 1 wherein said polyoxyalkylene alcohol ester occupies 2 to 10 % by weight the sum of said hard polyester, said soft polyester, said cross-linking monomer and said polyoxyalkylene alcohol ester.

4. The composition according to claim 1 wherein said soft polyester contains said polyoxyalkylene segment in an amount from 25 to 75 % by weight of the soft polyester.

5. The composition according to claim 1 wherein the proportions of said soft polyester and said polyoxyalkylene alcohol ester are such that the total polyoxyalkylene content is from 5 to 30 % by weight of the sum of said hard polyester, said soft polyester, said cross-linking monomer and said polyoxyalkylene alcohol ester.

6. The composition according to claim 1 wherein said cross-linking monomer occupies 10 to 70 % by weight of the sum of the hard polyester, the soft polyester, said cross-linking monomer and said polyoxyalkylene alcohol ester.

7. The composition according to claim 1 wherein said hard polyester is post-halogenated.

8. The composition according to claim 1 wherein about 40 to 80 mole % of the hydroxy group of the polyoxyalkylene alcohol is esterified.

9. An electrical laminate comprising a plurality of layers of a fibrous substrate impregnated with the resin composition of claim 1.

10. An electrical laminate comprising a plurality of layers of a fibrous substrate impregnated with the resin composition of claim 2.

11. An electrical laminate comprising a plurality of layers of a fibrous substrate impregnated with the resin composition of claim 3.

12. An electrical laminate comprising a plurality of layers of a fibrous substrate impregnated with the resin composition of claim 4.

13. An electrical laminate comprising a plurality of layers of a fibrous substrate impregnated with the resin composition of claim 5.

14. An electrical laminate comprising a plurality of layers of a fibrous substrate impregnated with the resin composition of claim 6.

15. An electrical laminate comprising a plurality of layers of a fibrous substrate impregnated with the resin composition of claim 7.

* * * * *